US007985000B2

(12) United States Patent
Dong

(10) Patent No.: US 7,985,000 B2
(45) Date of Patent: Jul. 26, 2011

(54) LIGHTING APPARATUS HAVING MULTIPLE LIGHT-EMITTING DIODES WITH INDIVIDUAL LIGHT-CONVERSION LAYERS

(75) Inventor: Yi Dong, Tracy, CA (US)

(73) Assignee: LedEngin, Inc., Santa Clara, CA (US)

( * ) Notice: Subject to any disclaimer, the term of this patent is extended or adjusted under 35 U.S.C. 154(b) by 0 days.

(21) Appl. No.: 12/420,800

(22) Filed: Apr. 8, 2009

(65) Prior Publication Data

US 2010/0259924 A1 Oct. 14, 2010

(51) Int. Cl.
*F21V 9/00* (2006.01)
*H01L 33/00* (2010.01)

(52) U.S. Cl. ............ 362/231; 362/84; 362/800; 257/96; 257/100

(58) Field of Classification Search .................. 362/231, 362/84, 235; 257/98, 100; 313/502, 503
See application file for complete search history.

(56) References Cited

U.S. PATENT DOCUMENTS

| | | |
|---|---|---|
| 5,742,120 A | 4/1998 | Lin |
| 5,959,316 A | 9/1999 | Lowery |
| 6,307,160 B1 | 10/2001 | Mei et al. |
| 6,351,069 B1 | 2/2002 | Lowery et al. |
| 6,608,332 B2 | 8/2003 | Shimizu et al. |
| 6,614,179 B1 | 9/2003 | Shimizu et al. |
| 6,642,652 B2 | 11/2003 | Collins, III et al. |
| 6,680,128 B2 | 1/2004 | Mei |
| 6,791,116 B2 | 9/2004 | Takahashi et al. |
| 6,828,170 B2 | 12/2004 | Roberts et al. |
| 6,833,565 B2 * | 12/2004 | Su et al. .......................... 257/98 |

(Continued)

FOREIGN PATENT DOCUMENTS

JP   2000-349346   12/2000

(Continued)

OTHER PUBLICATIONS

Kading, O.W., "Thermal Conduction in Metallized Silicon-Dioxide Layers on Silicon," Applied Physics, Sep. 1994, vol. 65, No. 13, pp. 1629-1631.

(Continued)

*Primary Examiner* — Ali Alavi
(74) *Attorney, Agent, or Firm* — Kilpatrick Townsend & Stockton LLP

(57) ABSTRACT

A lighting apparatus includes a combination of LED dice that emit light of a first color and a wavelength-shifting material (e.g., phosphor) that converts light of the first color to light of a second color. An appropriate combination of light of the first color and light of the second color can be used to produce light of a target color. In an embodiment, LED dice in the lighting apparatus are divided into two groups. Each LED die in the first group is combined with less wavelength-shifting material than needed to produce light of the target color, while each LED die in the second group is combined with more wavelength-shifting material than needed to produce light of the target color. As a result, the two groups produce light having colors on opposite sides of the target color in the International Commission on Illumination (CIE) chromaticity diagram. In some embodiments, the target color and color variations of both groups are on one straight line in the CIE chromaticity diagram, although it is to be understood that there might be small scattering within the groups. By adjusting the relative brightness of the two groups, the target color can be obtained.

29 Claims, 9 Drawing Sheets

U.S. PATENT DOCUMENTS

| | | | |
|---|---|---|---|
| 7,045,375 B1 * | 5/2006 | Wu et al. | 438/35 |
| 7,064,353 B2 | 6/2006 | Bhat | |
| 7,066,623 B2 * | 6/2006 | Lee et al. | 362/230 |
| 7,156,538 B2 | 1/2007 | Han et al. | |
| 7,157,744 B2 | 1/2007 | Palmteer et al. | |
| 7,168,608 B2 | 1/2007 | Mei | |
| 7,199,446 B1 | 4/2007 | Mei et al. | |
| 7,264,378 B2 | 9/2007 | Loh | |
| 7,473,933 B2 | 1/2009 | Yan | |
| 7,670,872 B2 | 3/2010 | Yan | |
| 7,772,609 B2 | 8/2010 | Yan | |
| 2001/0015778 A1 | 8/2001 | Murade | |
| 2002/0015013 A1 | 2/2002 | Ragle | |
| 2002/0079837 A1 | 6/2002 | Okazaki | |
| 2002/0163006 A1 | 11/2002 | Yoganandan et al. | |
| 2002/0191885 A1 | 12/2002 | Wu et al. | |
| 2003/0016899 A1 | 1/2003 | Yan | |
| 2003/0086674 A1 | 5/2003 | Yan et al. | |
| 2003/0095399 A1 | 5/2003 | Grenda et al. | |
| 2003/0116769 A1 | 6/2003 | Song et al. | |
| 2003/0122482 A1 | 7/2003 | Yamanaka et al. | |
| 2003/0227249 A1 | 12/2003 | Mueller et al. | |
| 2003/0230977 A1 | 12/2003 | Epstein | |
| 2004/0004437 A1 | 1/2004 | Shimizu et al. | |
| 2004/0051111 A1 * | 3/2004 | Ota et al. | 257/98 |
| 2004/0079957 A1 | 4/2004 | Andrews et al. | |
| 2004/0102061 A1 | 5/2004 | Watanabe | |
| 2004/0126918 A1 | 7/2004 | Kurahashi et al. | |
| 2004/0173810 A1 | 9/2004 | Lin et al. | |
| 2004/0201025 A1 | 10/2004 | Barnett et al. | |
| 2004/0257496 A1 | 12/2004 | Sonoda | |
| 2005/0035364 A1 | 2/2005 | Sano et al. | |
| 2005/0062140 A1 * | 3/2005 | Leung et al. | 257/678 |
| 2005/0093146 A1 | 5/2005 | Sakano | |
| 2005/0145872 A1 | 7/2005 | Fang et al. | |
| 2005/0179376 A1 | 8/2005 | Fung et al. | |
| 2005/0199900 A1 | 9/2005 | Lin et al. | |
| 2005/0224830 A1 | 10/2005 | Blonder et al. | |
| 2005/0253242 A1 | 11/2005 | Costello et al. | |
| 2005/0270666 A1 | 12/2005 | Loh et al. | |
| 2005/0286131 A1 | 12/2005 | Saxena et al. | |
| 2006/0012299 A1 | 1/2006 | Suehiro et al. | |
| 2006/0063287 A1 | 3/2006 | Andrews | |
| 2006/0082296 A1 | 4/2006 | Chua et al. | |
| 2006/0082679 A1 | 4/2006 | Chua et al. | |
| 2006/0091788 A1 | 5/2006 | Yan | |
| 2006/0097385 A1 | 5/2006 | Negley | |
| 2006/0170332 A1 | 8/2006 | Tamaki et al. | |
| 2006/0284209 A1 | 12/2006 | Kim et al. | |
| 2007/0194341 A1 | 8/2007 | Chang et al. | |
| 2007/0223219 A1 | 9/2007 | Medendorp et al. | |
| 2007/0274098 A1 * | 11/2007 | Wheatley et al. | 362/609 |
| 2007/0278512 A1 | 12/2007 | Loh et al. | |
| 2008/0308825 A1 | 12/2008 | Chakraborty et al. | |
| 2010/0091499 A1 | 4/2010 | Jiang et al. | |
| 2010/0155755 A1 | 6/2010 | Dong | |

FOREIGN PATENT DOCUMENTS

| | | |
|---|---|---|
| JP | 2000-349347 | 12/2000 |
| JP | 2001-057445 | 2/2001 |
| JP | 2002-185046 | 6/2002 |
| JP | 2004-241704 | 8/2004 |
| JP | 2004-253404 | 9/2004 |

OTHER PUBLICATIONS

Official Action for Japanese Patent Application No. 2005-315149, dated Jul. 21, 2009, 3 pages total.

"Solvent Soluble Polyimide with High Transparency and High Tg: HOP-400, 500," Hitachi Cable Review, Aug. 2003, No. 22, p. 78.

Yan, Xiantao, "Two Test Specimens for Determining the Interfacial Fracture Toughness in Flip-Chip Assemblies," Jun. 1998, Transactions of the ASME, vol. 120, pp. 150-155.

Yan, Xiantao, "Analysis Based Design Guidelines for Metal Runner and Passivation Layers in IC Packaging," DELPHI Automotive Systems, Analytical Engineering Conference, May 2000, pp. 1-4.

International Search Report and Written Opinion of PCT Application No. PCT/US2009/069070, dated Mar. 1 2010, 9 pages total.

Non-Final Office Action for U.S. Appl. No. 11/036,559, mailed on Aug. 18, 2009, 15 pages.

Non-Final Office Action for U.S. Appl. No. 11/036,559, mailed on Feb. 3, 2009, 8 pages.

Non-Final Office Action for U.S. Appl. No. 11/036,559, mailed on Sep. 16, 2008, 14 pages.

Final Office Action for U.S. Appl. No. 11/036,559, mailed on May 15, 2008, 17 pages.

Requirement for Restriction/Election for U.S. Appl. No. 11/036,559, mailed on Sep. 19, 2007, 11 pages.

Requirement for Restriction/Election for U.S. Appl. No. 11/036,559, mailed on Aug. 30, 2007, 5 pages.

Requirement for Restriction/Election for U.S. Appl. No. 11/036,559, mailed on Jun. 5, 2007, 5 pages.

Final Office Action for U.S. Appl. No. 11/036,559, mailed on Jun. 7, 2010, 11 pages.

Non-Final Office Action for U.S. Appl. No. 11/036,559, mailed on Apr. 12, 2011, 12 pages.

Requirement for Restriction/Election for U.S. Appl. No. 12/344,158, mailed on Apr. 4, 2011, 5 pages.

* cited by examiner

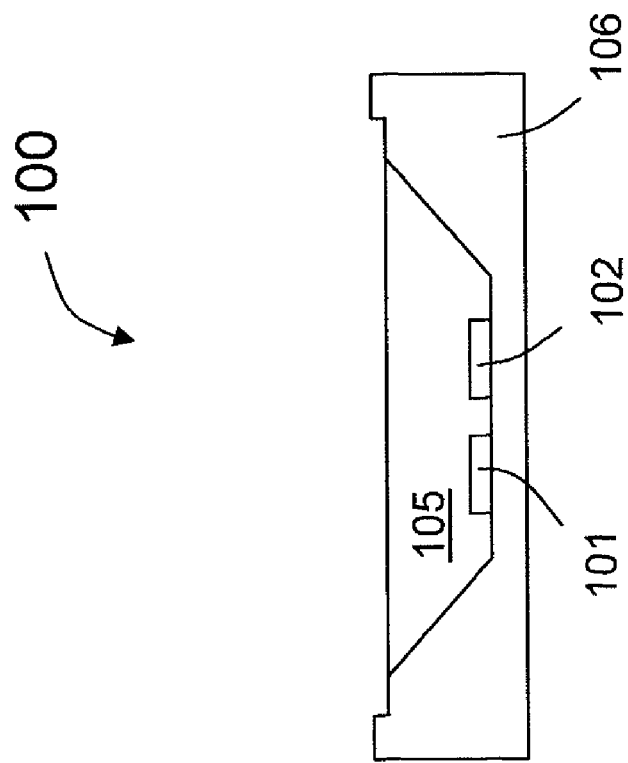
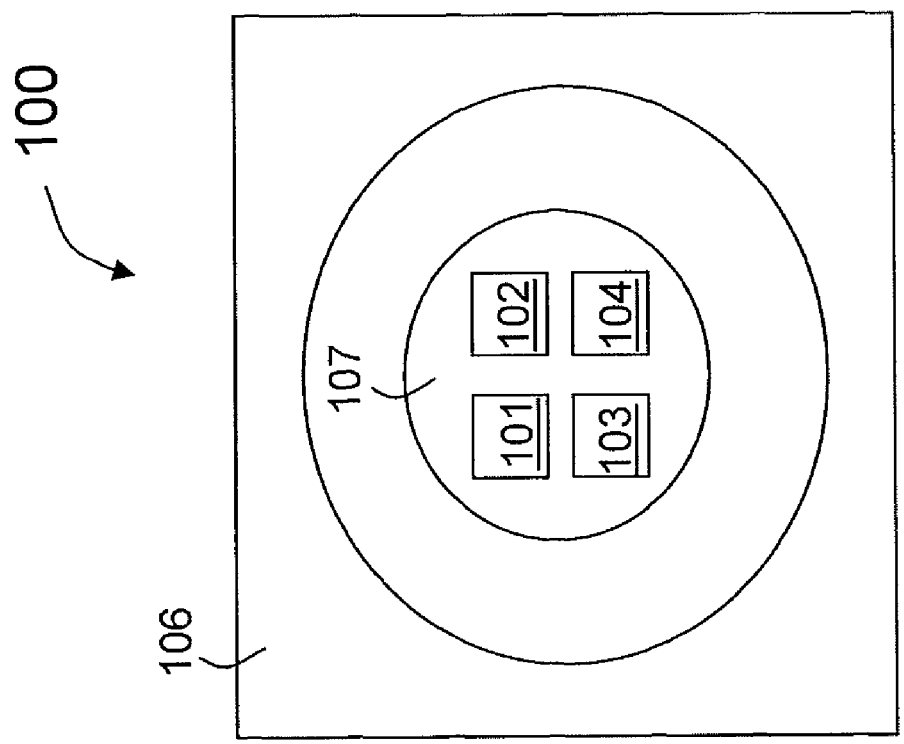
FIG. 1B
FIG. 1A

| No-Tune | Lumens | CIE x | CIE y | CCT (K) | CRI |
|---|---|---|---|---|---|
| Average | 451.3 | 0.4139 | 0.3922 | 3331 | 74.8 |
| STDEV | 9.75 | 0.0034 | 0.0029 | 48 | 0.38 |
| STDEV% | 2.16% | 0.82% | 0.74% | 1.43% | 0.51% |
| Maximum | 469.4 | 0.4212 | 0.3992 | 3433 | 75.7 |
| Minimum | 429.7 | 0.4069 | 0.3869 | 3242 | 74.1 |
| Max-Min | 39.7 | 0.0143 | 0.0123 | 191 | 1.6 |

| Tune | Lumens | CIE x | CIE y | CCT (K) | CRI |
|---|---|---|---|---|---|
| Average | 446.8 | 0.4154 | 0.3937 | 3313 | 74.7 |
| STDEV | 13.38 | 0.0006 | 0.0007 | 17 | 0.20 |
| STDEV% | 2.99% | 0.14% | 0.18% | 0.52% | 0.27% |
| Maximum | 473.3 | 0.4166 | 0.3949 | 3336 | 75.1 |
| Minimum | 417.5 | 0.4146 | 0.3924 | 3278 | 74.3 |
| Max-Min | 55.8 | 0.0020 | 0.0025 | 58* | 0.8 |

FIG. 7B

LIGHTING APPARATUS HAVING MULTIPLE LIGHT-EMITTING DIODES WITH INDIVIDUAL LIGHT-CONVERSION LAYERS

CROSS-REFERENCES TO RELATED APPLICATIONS

The application is related to commonly assigned U.S. patent application Ser. No. 12/344,158, filed Dec. 24, 2008 and entitled "LIGHT EMITTING DIODE WITH LIGHT CONVERSION LAYER," U.S. Provisional Patent Application Ser. No. 61/167,761, filed of even date herewith and entitled "PACKAGE FOR MULTIPLE LIGHT EMITTING DIODES," and U.S. patent application Ser. No. 12/420,802, filed of even date herewith and entitled "TOTAL INTERNAL REFLECTION LENS AND MECHANICAL RETENTION AND LOCATING DEVICE."

FIELD OF THE INVENTION

The present invention relates generally to lighting apparatus and more particularly to methods and apparatus for improved color control in light sources based on light-emitting diodes (LEDs).

BACKGROUND OF THE INVENTION

A light-emitting diode (LED) is a semiconductor device that produces light when an electric current is passed therethrough. LEDs have many advantages over conventional lighting sources, including compact size, low weight, longer life time, high vibration resistance, and higher reliability. In addition to having widespread applications for electronic products as indicator lights, LEDs also have become an important alternative light source for various applications where incandescent and fluorescent lamps have traditionally dominated.

Additionally, wider applicability of LEDs has been made possible through the use of phosphors in conjunction with LEDs. A phosphor is a luminescent material that, when excited by a light of a certain wavelength, produces a light at a different wavelength, thus modifying the output light of the LED. Accordingly, where a particular color is desired and that color cannot be produced by available LEDs cost effectively, phosphors can be used as light "converters" to alter the color of the light produced by an available LED to the desired color.

For example, phosphors are now used with monochromatic LEDs to produce white light. Using phosphors to convert the light produced by an LED to white light has proven to be a viable alternative to conventional white light sources, including incandescent light sources and the direct red-green-blue (RGB) LED methods in which multiple monochromatic LEDs are combined in an RGB scheme to produce white light.

In a typical LED-based white light producing device, a monochromatic LED is encapsulated by a transparent material containing appropriate compensatory phosphors. The wavelength(s) of the light emitted from the compensatory phosphor is complementary to the wavelength of the light emitted by the LED such that the wavelengths from the LED and the compensatory phosphor mix together to produce white light. For instance, a blue LED-based white light source produces white light by using a blue light LED and a phosphor that emits a yellowish light when excited by the blue light emitted from the LED. In these devices the amount of the phosphor in the transparent material is carefully controlled such that only a fraction of the blue light is absorbed by the phosphor while the remainder passes unabsorbed. The yellowish light and the unabsorbed blue light mix to produce white light.

Another exemplary scheme uses an LED that produces light outside of the visible spectrum, such as ultraviolet (UV) light, together with a mixture of phosphors capable of producing either red, green, or blue light when excited. In this scheme, the light emitted by the LED only serves to excite the phosphors and does not contribute to the final color balance.

As demand for better lighting devices continues to increase, it would be desirable to provide cost-effective LED-based lighting sources having improved color control, as well as efficiency and brightness.

BRIEF SUMMARY OF THE INVENTION

Even though conventional LED-based white light sources have found wide application, they suffer from many limitations. One common problem is that conventional LED-based white light sources often have wide color variations in the light they produce. As described in more detail below, many conventional LED-based lighting devices cannot meet stringent color specifications. This limitation can lead to yield loss and high manufacturing cost.

In various embodiments, the present invention relates to methods and devices with improved color control; in some embodiments, stringent light color specifications can be met.

In an embodiment, a lighting apparatus includes a combination of LED dice and wavelength-shifting material (e.g., phosphor) to produce light of a target color. The LED dice may emit light of a first color, and the wavelength-shifting material may convert light of the first color to light of a second color. An appropriate combination of light of the first color and light of the second color can be used to produce light of the target color. In an embodiment of the invention, the LED dice in the lighting apparatus designed for a target color are divided into two groups. Each LED die in the first group is combined with less wavelength-shifting material than needed to produce light of the target color, while each LED die in the second group is combined with more wavelength-shifting material than needed to produce light of the target color. As a result, the two groups produce light having colors on opposite sides of the target color in the well-known International Commission on Illumination (CIE) chromaticity diagram. By adjusting the relative brightness of the two groups, the target color can be obtained. Using this method, the lighting apparatus can be configured to emit light within a relatively small range of colors. Consequently, substantially all lighting apparatus formed using this method can meet a color specification. As a result, the yield of lighting apparatus can be greatly increased and manufacturing cost can be reduced.

Although embodiments described herein refer to LED-based white light sources, it will be appreciated that the invention has a much broader range of applicability. For example, various combinations of phosphors and light sources having different colors can be used to produce a substantially uniform light of a desired color or a combination of light having multiple colors.

According to an embodiment of the present invention, a method for making a lighting apparatus includes, for an LED die of a plurality of LED dice configured to emit a first color, determining a target amount of a wavelength-shifting material capable of converting light of the first color to light of a second color, wherein the target amount is an amount that, when combined with light from the LED die, will result in light of a third color. The LED dice are disposed on a substrate to form a lighting apparatus. The method includes depositing less than the target amount of the wavelength-shifting material over each of a first subset of the LED dice, and depositing more than the target amount of the wavelength-shifting material over each of a second subset of the LED dice. A power controller is coupled to the first subset and the second subset of the LED dice for adjusting their relative brightness such that the lighting apparatus is configured to produce light of the third color.

In a specific embodiment of the above method, the wavelength-shifting material is mixed in a base material to form a light-conversion material, and the amount of wavelength-shifting material deposited is controlled by controlling an amount of the light-conversion material deposited. In another embodiment, the amount of wavelength-shifting material deposited is controlled by controlling a ratio of the wavelength-shifting material to the base material in the light-conversion material. In a specific embodiment, the first color is blue, the second color is yellow, and the third color is white. In this case, the wavelength-shifting material may include yellow phosphor.

In another specific embodiment of the above method, the amount less than the target amount is selected such that the LED dice in the first subset is configured to provide cool white light in conjunction with the wavelength-shifting material, and the amount more than the target amount is selected such that the LED dice in the second subset is configured to provide warm white light in conjunction with the wavelength-shifting material. In some embodiments, the wavelength-shifting material can include both yellow and red phosphors. In an example, the wavelength-shifting material includes yellow and red phosphors at a yellow:red weight ratio of about 4:1. In another example, the wavelength-shifting material includes yellow and red phosphors at a yellow:red weight ratio of about 20:1. In another embodiment, the first color is green, the second color is magenta, and the third color is white. In yet another embodiment, the first color is red, the second color is cyan, and the third color is white. In yet another embodiment of the method, adjusting relative brightness of the first subset and the second subset of the plurality of LED dice includes using one or more variable resistances to adjust currents in the first subset and the second subset of LED dice.

In another embodiment of the present invention, a lighting apparatus includes a first set of one or more light-emitting diode (LED) dice, each configured to emit light of a first color and having a first amount of a complementary wavelength-shifting material disposed thereover. The first amount is an amount less than required to produce white light in conjunction with light of the first color. The lighting apparatus also includes a second set of one or more LED dice, each configured to emit light of the first color and having a second amount of the complementary wavelength-shifting material disposed thereover. The second amount is an amount more than required to produce white light in conjunction with light of the first color. The lighting apparatus also includes a power control circuit coupled to the first set and the second set of LED dice. The power control circuit is configured to control the relative brightness of the first set and the second set of LED dice.

In some embodiments of the above apparatus, the wavelength-shifting material is mixed in a base material to form a light-conversion material, and the first set of LED dice and the second set of LED dice have different amounts of the light-conversion material overlaid thereon. In other embodiments, the first set of LED dice and the second set of LED dice have different ratios of the wavelength-shifting material to the base material in the light-conversion material overlaid thereon. In some embodiments, the first amount of the wavelength-shifting material is an amount that, in conjunction with light from the first set of LED dice, will produce cool white light, and the second amount of the wavelength-shifting material is an amount that, in conjunction with light from the second set of LED dice, will produce warm white light. In a specific embodiment, the first color is blue, and the wavelength-shifting material includes yellow phosphor.

In some embodiments of the above apparatus, the complementary wavelength-shifting material is configured to convert light of the first color to light of a second color complementary to the first color. In one example, the first color is green, and the second color is magenta. In another example, the first color is red, and the second color is cyan. In certain embodiments, the wavelength-shifting material can include both yellow and red phosphors. In a specific example, the wavelength-shifting material includes yellow and red phosphors at a weight ratio of about 4:1. In another example, the wavelength-shifting material includes yellow and red phosphors at a weight ratio of about 20:1. In a specific embodiment, the power control circuit includes one or more variable resistances for adjusting currents in the first and second sets of LED dice.

In yet another embodiment of the present invention, a lamps includes a first set of one or more light-emitting diode (LED) dice, each of which is configured to emit light of a first color and has a first amount of a complementary wavelength-shifting material disposed thereover. The first amount is an amount less than required to produce white light in conjunction with light of the first color. The apparatus also includes a second set of one or more LED dice, each of which is configured to emit light of the first color and has a second amount of the complementary wavelength-shifting material disposed thereover. The second amount is an amount more than required to produce white light in conjunction with light of the first color. Moreover, the lighting apparatus includes a primary lens overlying the first set and the second set of LED dice, and a secondary lens overlying the first set and the second set of LED dice and the primary lens. The secondary lens is configured to mix light from the first set and the second set of LED dice at least partially via total internal reflection. Furthermore, a power control circuit is coupled to the first set and the second set of LED dice. The power control circuit is configured to control the relative brightness of the first set and the second set of LED dice such that the lighting apparatus is adapted to produce white light.

In an embodiment of the above lighting apparatus, each of the first set of LED dice is configured to produce cool white light, and each of the second set of LED dice is configured to produce warm white light. In an embodiment, the wavelength-shifting material is mixed in a base material to form a light-conversion material, and the first set of LED dice and the second set of LED dice have different amounts of the light-conversion material overlaid thereon. In another embodiment, the first set of LED dice and the second set of LED dice have different ratios of the wavelength-shifting material to the base material in the light-conversion material overlaid thereon. In an embodiment, the first amount of the wavelength-shifting material is an amount that, in conjunction with light from the first set of LED dice, will produce cool white light, and the second amount of the wavelength-shifting material is an amount that, in conjunction with light from the second set of LED dice, will produce warm white light. In a specific embodiment, the first color is blue, and the wavelength-shifting material comprises yellow phosphor.

Various additional objects, features, and advantages of the present invention can be more fully appreciated with reference to the detailed description and accompanying drawings that follow.

BRIEF DESCRIPTION OF THE DRAWINGS

FIGS. 1A and 1B are simplified top view and cross-sectional view, respectively, of a conventional LED-based light emitting device having multiple LED dice;

FIG. 7B lists performance parameters for the lighting apparatus of FIG. 7A; and

DETAILED DESCRIPTION OF THE INVENTION

Embodiments of the present invention relate to a lighting apparatus having improved color control and methods for making such apparatus. In a specific application, blue LEDs and controlled amounts of yellow phosphor are used to produce white light having the desired light color or color temperature. The improve color control can increase production yield within a given color specification and thereby reduce manufacturing cost compared to conventional devices. But it will be recognized that the invention has a much broader range of applicability.

Before embodiments of the present invention are described in detail below, certain limitations of conventional white light LED devices are first analyzed. FIGS. 1A and 1B are simplified top view and cross-sectional view, respectively, of a conventional LED-based lighting device 100 having multiple LED dice. As shown in FIG. 1A, four LED dice 101-104 are disposed in a recess 107 on substrate 106. As shown in FIG. 1B, a light-converting material 105, such as a phosphor-containing material, is deposited over the LED dice. For example, for a white light device, LED dice 101-104 may be blue LEDs, and light-converting material 105 may be include yellow phosphor.

Although finding increasingly wider applications, conventional devices suffer from many limitations. One of the limitations is color variation often observed in phosphor packaged white LED devices, as illustrated below.

Figure 2:
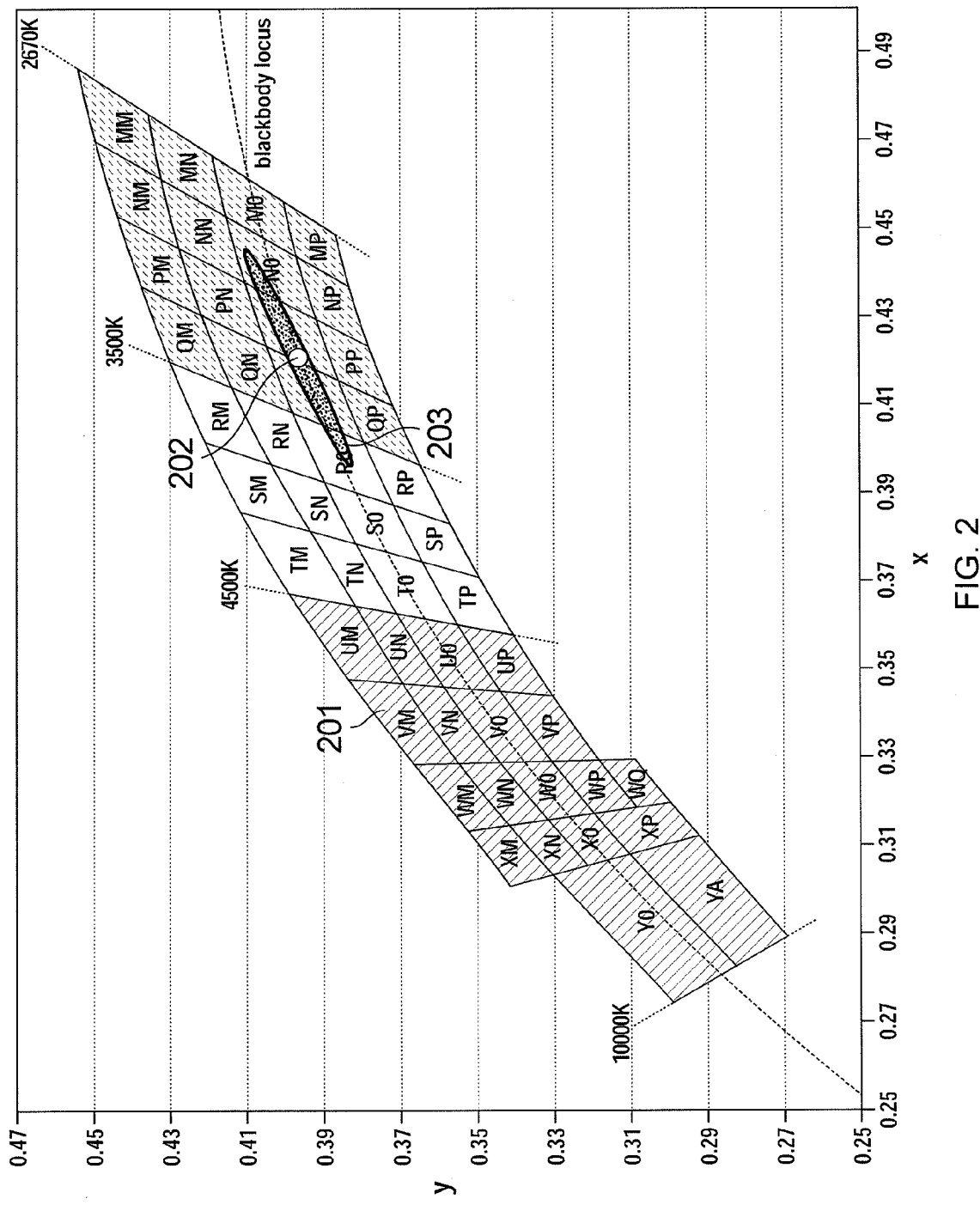
FIG. 2 is a partial CIE chromaticity diagram illustrating color distribution of a group of conventional packaged white LED devices.

FIG. 2 is a partial International Commission on Illumination (CIE) chromaticity diagram illustrating color distribution of a group of conventional packaged white LED devices. In FIG. 2, region 201 corresponds to a color range in the vicinity of a generally accepted definition of white light in CIE coordinates X and Y. i.e., with X in the range of (0.25-0.49) and Y in the range of (0.25-0.47). Conventional LED-based white light devices are often manufactured with a target white color specification having a relatively tight distribution in the CIE diagram, such as region 202 in FIG. 2. However, there is usually substantial variation in the actual color emitted from the lighting devices. An example of the color distribution of conventional LED-based white light devices is shown as elliptical region 203 in FIG. 2. Such wide distribution may be caused by variation in the wavelengths emitted by the LED dice or phosphor material associated with each die, packaging, or other limitations in the manufacturing process or material reliability. In lighting applications where a consistent color is required, such wide distribution is often unacceptable. As a result, many devices may fail to meet manufacturing specification, leading to low yield and high production cost. For instance, in the case represented by FIG. 2, all lighting devices outside region 202 might have to be discarded.

Therefore, a method for improving color control of LED-based lighting apparatus is highly desirable.

Figure 3:
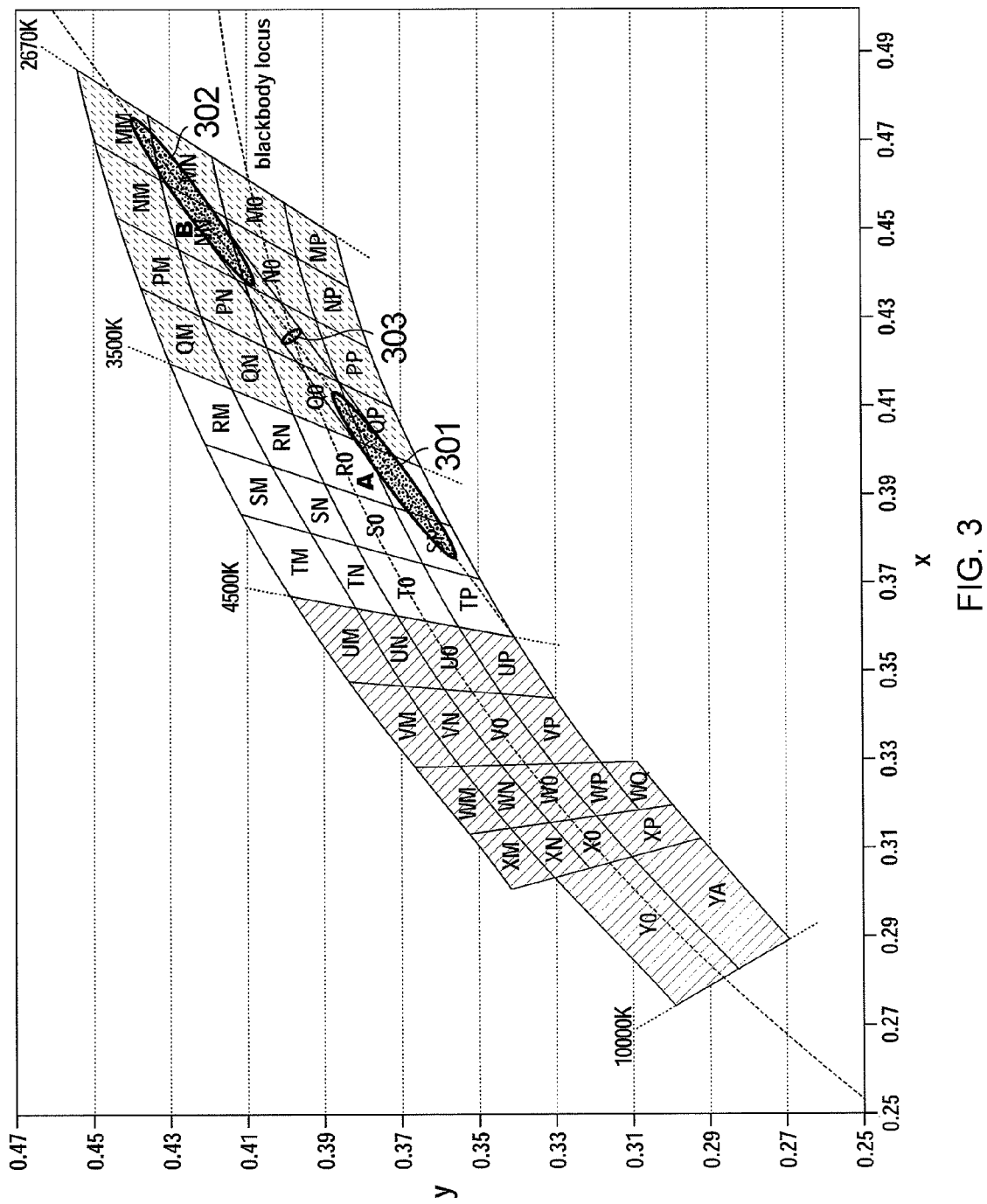
FIG. 3 is a partial CIE diagram illustrating an operating principle according to an embodiment of the present invention.

FIG. 3 is a partial CIE diagram illustrating an operating principle according to an embodiment of the present invention. In FIG. 3, color distribution of two groups of light source devices, such as LED-based lighting apparatus, is shown. Region 301 represents the color variation in a first group of lighting devices (referred to herein as "group A"). Even thought there can be substantial color distribution within group A, all devices in the first group produce "cool white" light, i.e., more blue than the target white light. Similarly, Region 302 represents the color variation in a second group of lighting devices (referred to herein as "group B"). All devices in group B produce "warm white" light, i.e., more yellow than the target white light. According to an embodiment of the invention, a lighting apparatus is formed by using one or more LED-based light devices from the first group in combination with one or more LED-based light devices from the second group. Then, the relative brightness of the LED-based light devices from both groups is adjusted, e.g., by varying the current through the LEDs, such that the combination of light devices produces the target white light, which is shown as the region 303 in FIG. 3. Since colors from these two groups reside on opposite sides of the target color in the CIE chromaticity diagram, i.e., they are complementary to each other, their colors can compensate for each other, and the final resulting color can be controlled by adjusting their respective brightness.

In some embodiments, the two groups of white light apparatus—the cool white group and the warm white group—can be selected from a collection of white light LED devices (e.g., with blue LED and yellow phosphor) which have an inherent color variation as a result of manufacturing process. The first group includes those LED devices that emit cooler white light than the target white color, and the second group includes those LED devices that emit warmer white light. A lighting apparatus can be formed by combining one or more LED devices from the first group and one or more LED devices from the second group and adjusting relative brightness as described above.

Figure 4:
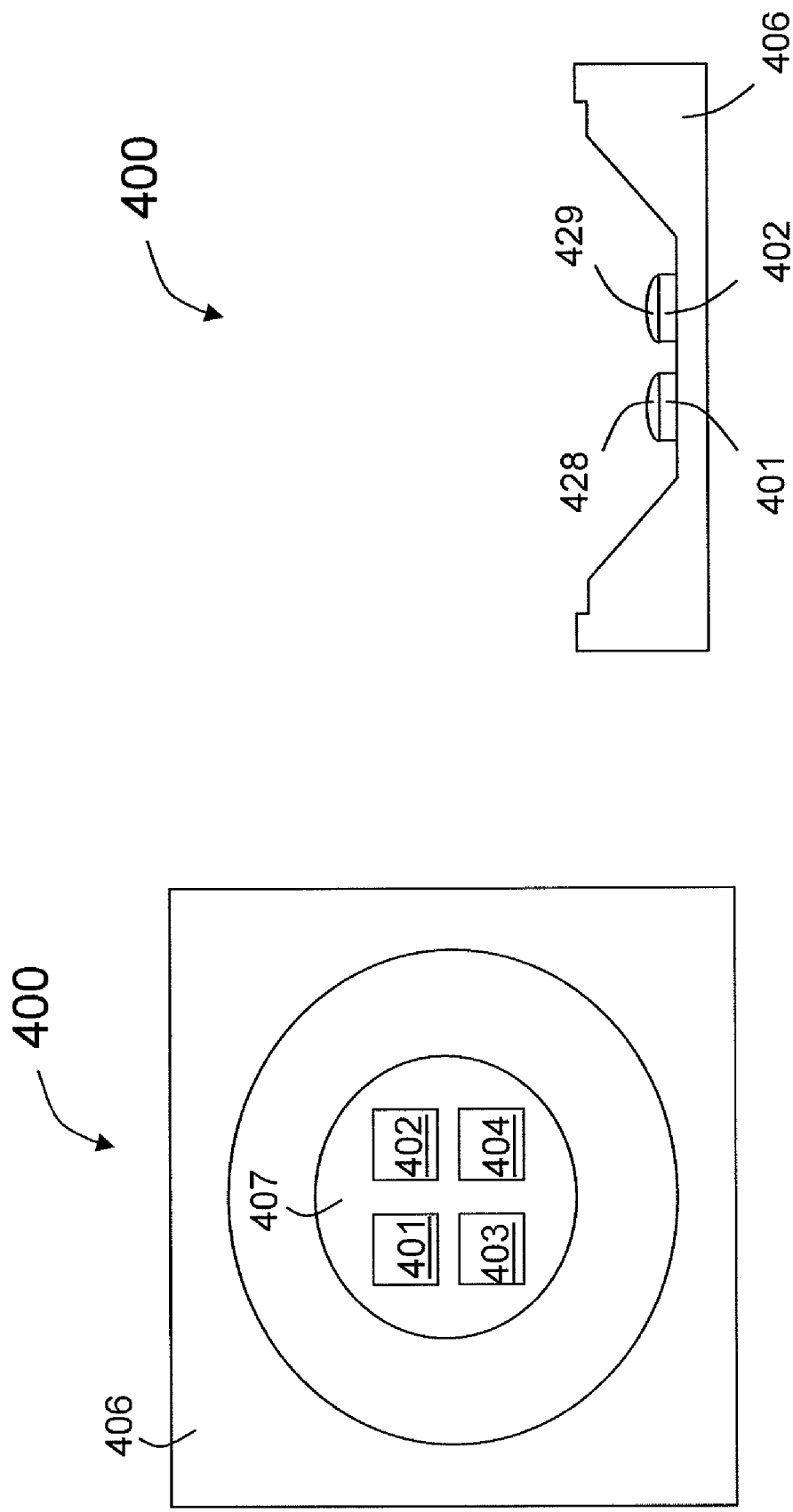
FIGS. 4A and B are simplified top view and cross-sectional view, respectively, of an LED-based lighting device having multiple LED dice according to an embodiment of the present invention.

In other embodiments, two groups of white light apparatus—the cool white group and the warm white group—can be formed by varying the amount of phosphor on the LED dice in each group. FIGS. 4A and B are simplified top view and cross-sectional view, respectively, of an LED-based lighting device 400 having multiple LED dice. As shown in FIG. 4A, four LED dice 401-404, e.g., blue LEDs, are disposed in a recess 407 on substrate 406. In FIG. 4B, each LED die has a phosphor-containing material, e. g., 421 and 422, deposited thereon. The phosphor-containing material is deposited over the top surface of each LED die, and the side surfaces of the LED are substantially free of the phosphor-containing material. This deposition process may be performed using a syringe or a needle for each of the LEDs, such that the amount of phosphor-containing material can be different for each LED die. Further details of methods for depositing phosphor over individual LED dice can be found, for example, in commonly assigned U.S. patent application Ser. No. 12/344,158, filed on Dec. 24, 2008 and entitled "LIGHT-EMITTING DIODE WITH LIGHT-CONVERSION LAYER."

Figure 5:
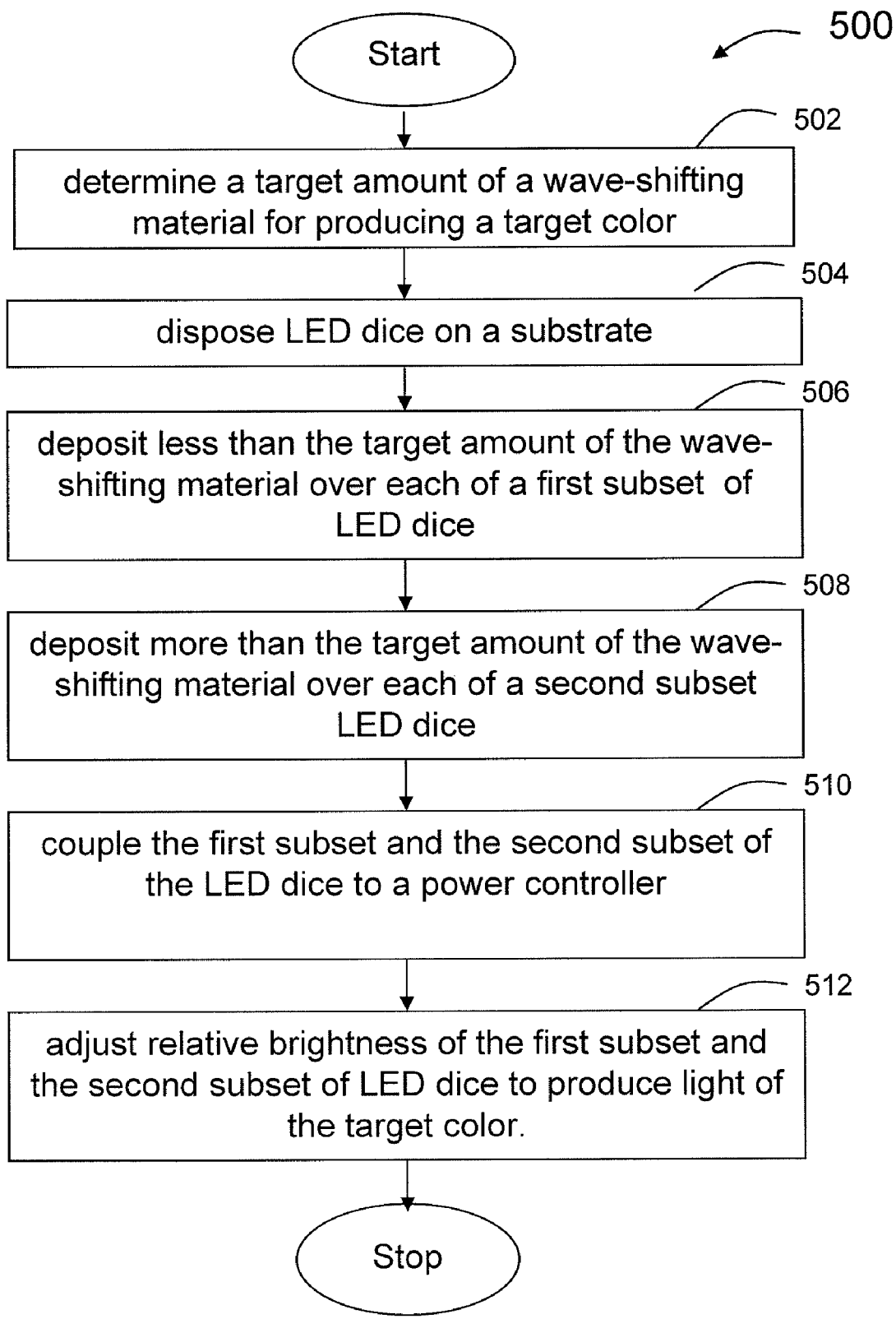
FIG. 5 is a simplified flow chart illustrating a method for forming a lighting apparatus according to an embodiment of the present invention.

FIG. 5 is a flow diagram of a process 500 for making a white light apparatus according to an embodiment of the invention. This embodiment pertains to LED dice configured to emit a first color and a wavelength-shifting material, e.g., phosphor, capable of converting the first color to a second color. For example, the method can be applied to blue LED dice and yellow phosphors for producing white light.

At step 502 of process 500 in FIG. 5, a target amount of the wavelength-shifting material is determined, so that when the target amount the wavelength-shifting material is combined with light from an LED die, light of a desired third color is produced. In the white light example of yellow phosphor and blue LED, the target amount of yellow phosphor is the amount needed to produce the desired white light (e.g., within region 303 of FIG. 3) when combined with a blue LED.

At step 504 in FIG. 5, the LED dice are disposed on a substrate to form a lighting apparatus. An example is illustrated in FIG. 6, in which lighting apparatus 600 has four blue LED dice 601-604 disposed on substrate 610. The goal is to form a lighting apparatus 600 that will produce white light within region 303 of FIG. 3.

Figure 6B:
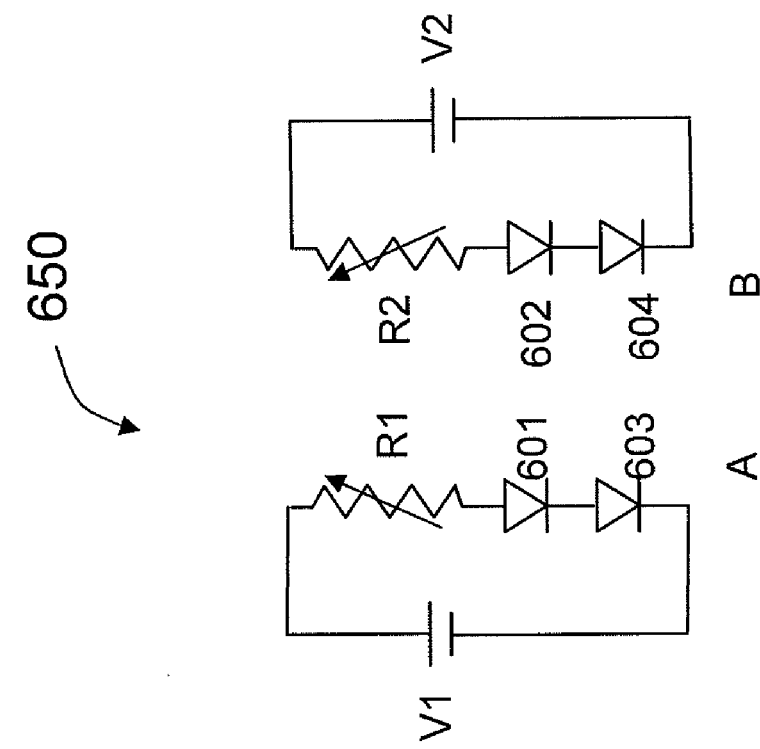
FIG. 6B is a simplified schematic diagram illustrating a method for adjusting the relative brightness of two groups of LED dice in the lighting apparatus of FIG. 6A.
Figure 6A:
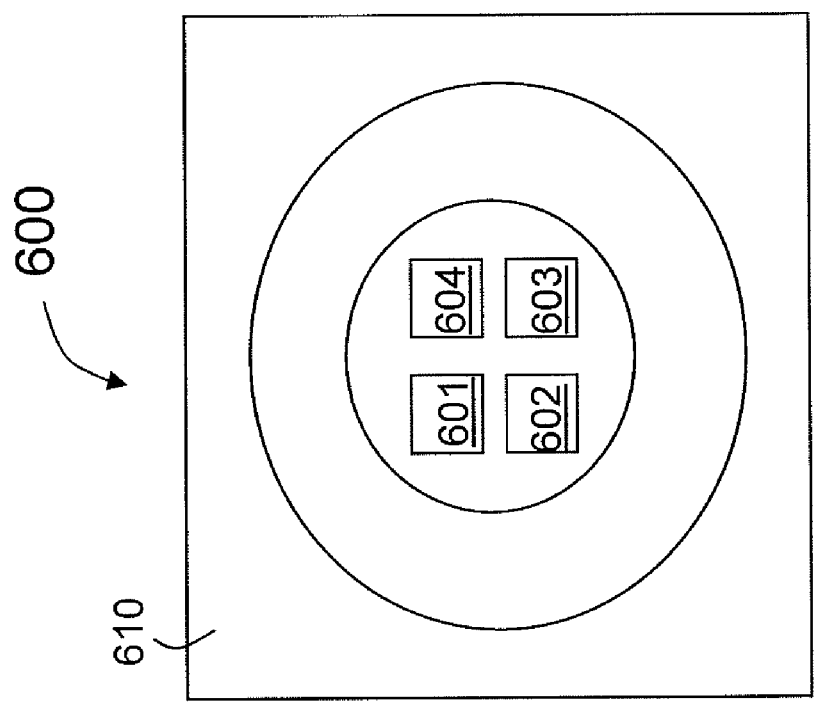
FIG. 6A is a simplified top view diagram of a lighting apparatus illustrating a method for forming a lighting apparatus having four LED dice according to an embodiment of the present invention.

At step 506 of process 500, less than the target amount of the wavelength-shifting material is deposited over each of a first subset of the LED dice. At step 508 of process 500, more than the target amount of the wavelength-shifting material is deposited over each of a second subset of the LED dice. Referring to FIG. 6A, blue LEDs 601 and 603 can be defined as the first subset, while blue LEDs 602 and 604 are defined as the second subset. Here, less than the target amount of yellow phosphor is deposited over LEDs 601 and 603. The light color produced by such a combination is more blue than the target white color (e.g., region 301 in FIG. 3). Similarly, more than the target amount of yellow phosphor is deposited over LEDs 602 and 604, which will produce light that is more yellow than the target white color, e.g., in region 302 of FIG. 3.

In steps 606 and 608, the deposition of phosphor over each individual LED die may be performed using a syringe or a needle as described above with reference to FIG. 4, or by other methods.

In one embodiment, the phosphor may be mixed in a base material such as silicone to form a light-conversion material. In this case, the amount of phosphor deposited can be controlled by controlling an amount of light-conversion material deposited. In another embodiment, the amount of phosphor deposited can be controlled by controlling a ratio of phosphor to silicone in the light-conversion material.

It is also noted that apparatus 600 can have packaging and electrical connection designs that allow individual LEDs in the apparatus to be connected to different terminals from a power source to receive different currents. An example of a suitable package is described in commonly owned U.S. Provisional Patent Application Ser. No. 61/167,761, filed of even date herewith, entitled "PACKAGE FOR MULTIPLE LIGHT EMITTING DIODES."

At step 510 of process 500, the first subset of the LED dice and the second subset of the LED dice are coupled to a power controller. In one embodiment, the power controller can be used such that two separate adjustable current sources are provided to the two groups of LEDs, respectively. FIG. 6B is a simplified schematic diagram in which the current source is shown as a variable resistor R in series with a voltage supply V. In FIG. 6B, the "A" group, including LEDs 601 and 603, is coupled to a first adjustable current source (represented by V1 and R1), and the "B" group, including LEDs 602 and 604, is coupled to a second adjustable current source (represented by V2 and R2).

At step 512 of process 500, using the power controller, the relative brightness of the two groups of LED dice is adjusted such that the lighting apparatus is configured to produce light of the desired color. In FIG. 6, the brightness of each group can be controlled by adjusting the variable resistors R1 and R2. Of course, others method of current adjustment can also be used. In a specific embodiment, a rheostat can be used for adjusting current. As described above, light from the two groups are complementary and can compensate for each other. As shown in FIG. 3, by adjusting the relative brightness of group A in region 301 and group B in region 302, the target color in region 303 can be obtained.

Figure 7A:
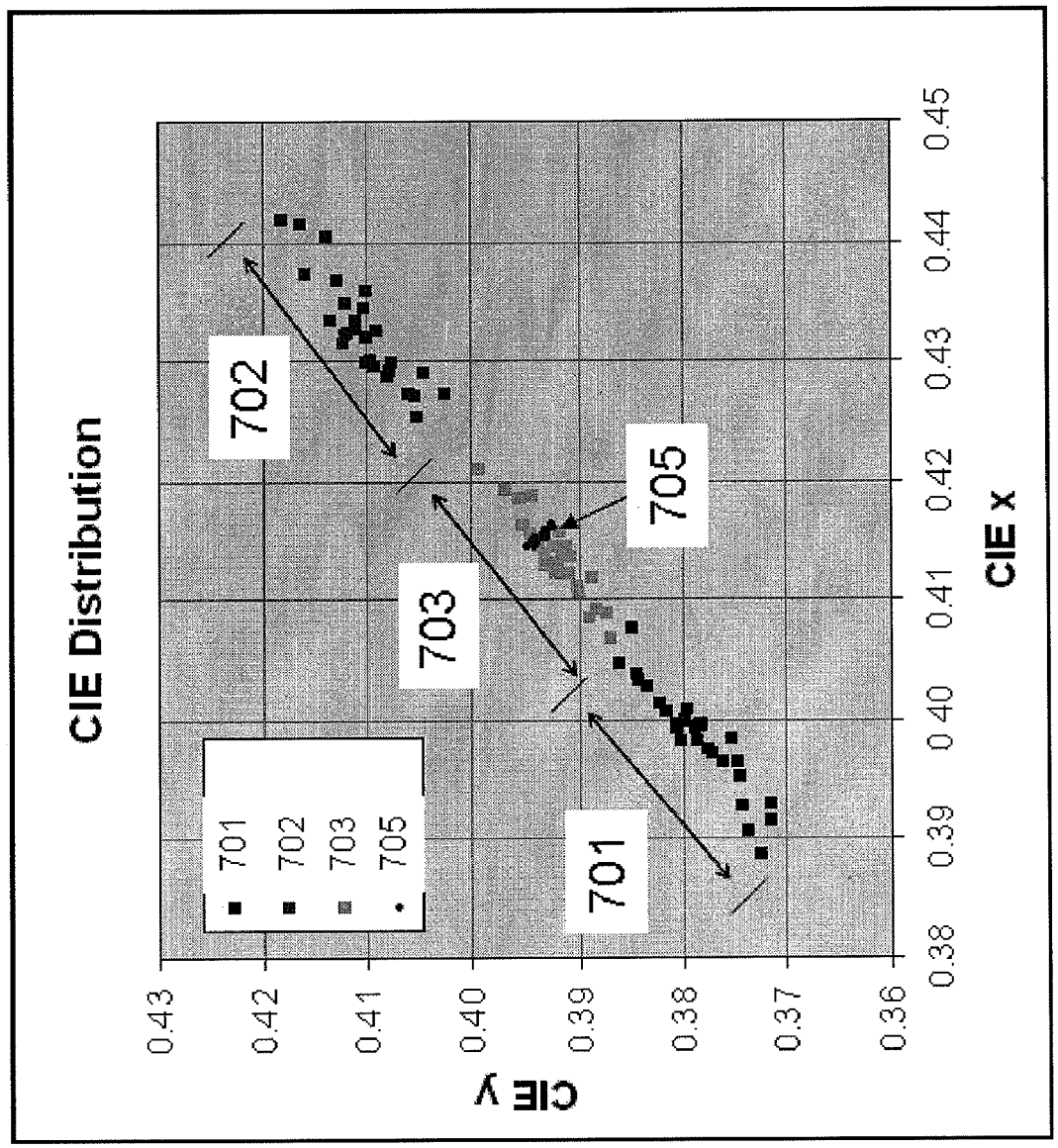
FIG. 7A is a simplified CIE color diagram illustrating color variations of lighting apparatus formed according to the method of FIG. 5.

Performance of certain lighting apparatus formed according to embodiments of the invention has been tested. In one experiment, each of 28 white light apparatus had four LED dice with yellow phosphor. Two of the LED dice were adapted to produce cool white and the other two were adapted to produce warm white light, similar to apparatus 600 of FIG. 6. For each of the 28 apparatus, the color of emitted light was measured. The results are illustrated in the partial CIE chromaticity diagram of FIG. 7A. Each data point in region 701 represents the color of the light of one of the 28 apparatus when only the two cool LED dice were turned on, and each data point in region 702 represents the light color of an apparatus when only the two warm LED dice were turned on. As can be seen, the two groups reside on opposite sides of the target color in region 705 and have substantial scattering in color distribution. The wide variation in light color is also obvious in region 703, in which ach data point represents the color of an apparatus when all four LED dice were turned on, i.e., the color of the combined light from the two cool LED dice and two the warm LED dice in each of the 28 apparatus.

In contrast, a much narrower distribution of light color was obtained in region 705, in which each data point represents the light color when the LED currents in the "cool white" group and the "warm white" group in each of the 28 apparatus were adjusted so that each apparatus produced a white color light in close proximity to the target color. It can be seen that substantial reduction in the variation of light color can be achieved using the method described above.

In this particular example, the current in each LED die was nominally 700 mA. In a specific embodiment, one group of two LED dice can receive more than 700 mA and the other group can receive less than 700 mA, keeping the total current at 1400 mA. But other current adjustment arrangement can also be used.

The tables in FIG. 7B lists statistical performance parameters for the lighting apparatus obtained from the experiment. As shown, statistical data of Lumens, CIE x, CIE y, CCT(K), and CRI for region 703 and region 705, respectively, are listed. It can be seen from the "STDEV" and "Max-Min" rows that region 705 exhibits much tighter color distribution. It is noted that in this experiment, the tuning (or current adjustment) was carried out to adjust CIE coordinates (x,y) to obtain a smallest distribution of CIE x and CIE y. Alternatively, the tuning can also be carried out to reduce the spread in CCT (correlated color temperature), Lumens, CRI (color rendering index), or other parameters.

Figure 8:
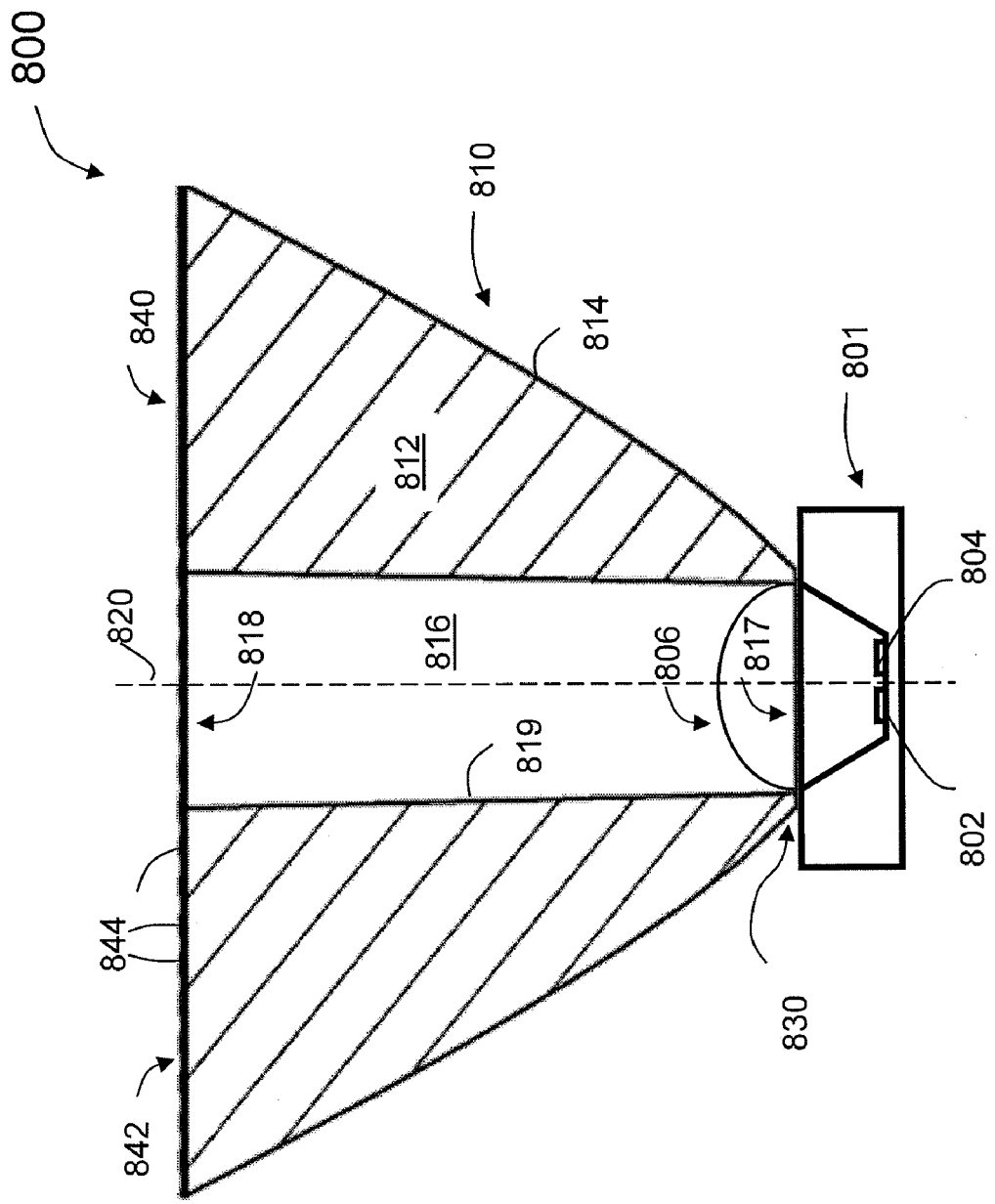
FIG. 8 is a simplified cross-sectional view diagram illustrating a white light apparatus according to another embodiment of the present invention.

A lighting apparatus in accordance with embodiments of the invention can be incorporated in a lamp. FIG. 8 is a simplified cross-sectional diagram illustrating a white light lamp 800 according to another embodiment of the present invention. As shown, lamp 800 includes light source 801, primary lens 806, and secondary lens 810. Light source 801 can include multiple LEDs, two of which, 802 and 804, are shown in FIG. 8.

In an embodiment, the multiple LEDs are divided into two sets, similar to apparatus 600 of FIG. 6 described above. Each of the first set of one or more light-emitting diode (LED) dice is configured to emit blue light and having a first amount of a complementary wavelength-shifting material, e.g., yellow phosphor, disposed thereover. The first amount is an amount less than required to produce white light in conjunction with light of the first color. In other words, the first set of LEDs are configured to produce cool white light. In the second set of one or more LED dice, each has a second amount of the complementary wavelength-shifting material disposed thereover. The second amount is an amount more than required to produce white light in conjunction with light of the first color. Accordingly, the second set of LEDs are configured to produce warm white light. Any number of LEDs can be used, for example, 4, 12, or 16 LEDs.

Lamp 800 also has a power control circuit (not shown) coupled to the first set and the second set of LED dice. The power control circuit is configured to adjust the relative brightness of the first set and the second set of LED dice such that lamp 800 is configured to produce white light. A power control circuit having variable resistances can be used for this purpose, as described above. Alternatively, other suitable power control circuits can also be used.

Lamp 800 also has a primary lens 806 overlying the first set and the second set of LED dice, e.g., 802 and 804. Moreover, apparatus 800 has a secondary lens 810 overlying the first set and the second set of LED dice and the primary lens 806. In an embodiment, secondary lens 810 is configured to mix light from the first set and the second set of LED dice at least partially via total internal reflection. Additionally, lens 810 is configured to provide substantially centered projected light even when the light source is positioned off the optical axis. For example, both LEDs 802 and 804 in FIG. 8 are positioned off the optical axis 820.

In a specific embodiment, secondary lens 810 has a body member 812, which has an outer surface region 814 and an interior open channel 816 that extends longitudinally through the body member 812. Body member 812 and interior open channel 816 are substantially symmetric with respect to optical axis 820. In an embodiment, the outer surface region 814 is shaped to provide total internal reflection.

As shown in FIG. 8, secondary lens 810 has a first end region 830 at a first end 817 of open channel 816 for accommodating a light source. Lens 810 also has a second end region 840 at a second end 818 of open channel 816 opposite the first end region 830. The second end region 840 has a circular surface 842 including a plurality of microlenses 844 positioned around the second end 818 of open channel 816.

In certain embodiments, the various features of secondary lens 810 contribute to the optical properties of the lens. For example, the interior open channel 816 is provided for collimating light in the center region. The total-internal-reflection surface 814 can prevent light loss, and the multiple refractive surface regions 1144 can help to distribute light uniformly.

Further details of the secondary lens can be found in, for example, commonly assigned U.S. patent application Ser. No. 12/420,802, filed of even date herewith and entitled "TOTAL INTERNAL REFLECTION LENS AND MECHANICAL RETENTION AND LOCATING DEVICE."

While the invention has been described with reference to specific embodiments, those skilled in the art will appreciate that numerous variation and modifications are possible. For instance, in the specific examples described above, the two groups are represented by cool white light and warm white light, respectively, with combinations of blue LED dice and yellow phosphor material. However, the wavelength-shifting material needs not be a single material, such as a single type of phosphor. In certain applications, blue LED dice can be combined with wavelength-shifting material that includes yellow and red phosphors. As an example, a combination of yellow and red phosphors at a yellow:red weight ratio of about 4:1 can be used in warm white lighting apparatus, while a combination of yellow and red phosphors at a weight ratio of about 20:1 can be used in cool white lighting apparatus.

In an alternative embodiment, a method for making a white light device uses LEDs that are binned based on blue wavelength. Substantially the same amount of phosphor is deposited over each of LEDs. In an embodiment, the resulting white light distribution may correlate with the original binning. Two groups of LEDs can be selected, one emitting cooler white color and the other emitting warmer white color. Then the relative brightness of the two groups can be adjusted to obtain the target white light color. In some embodiments, the target color and color variations of both groups are on one straight line in the CIE chromaticity diagram, although it is to be understood that there might be small scattering within the groups.

Additionally, the method can be used with different color light sources and different wavelength-shifting materials. For example, complementary colors such as red and cyan or green and magenta can be used with the invention to form white light sources, in addition to the examples of combining blue and yellow light described above. Moreover, different types of phosphors or other wavelength-shifting materials can be included in the same light-conversion layer.

Depending on the application, the white light apparatus may include 4, 6, 8, 12, 16, or more LED dice. In this case, the "cool white" group and the "warm white" group each can have 2, 3, 4, 6, or 8, etc, LED dice. While it may be desirable to evenly divide the LED dice in two groups, other groupings can also be used. In one embodiment, two power sources can be used, one for the "cool white" group and the other for the "warm white" group. In this case, the brightness of each group can be adjusted by varying the current output of each power source.

In other embodiments, the target light color need not be white. For these applications, two groups of LED/wavelength-shifting material combination are formed that emit light residing on either side of the target color in the CIE chromaticity diagram. In other words, the two groups are complementary with respect to the target color. In a specific embodiment, the relative brightness of these two groups are adjusted to produce the target color.

In still other embodiments, the methods described above can also be used to make color adjustment during the operation life time of the lighting apparatus. For example, the color of the apparatus may shift due to component aging or material reliability issues in the apparatus. In other applications, a different shade of light color may become desirable after the apparatus has been installed. In these cases, the brightness of each group of LED devices in the apparatus can be adjusted using the methods described above to provide the desired color.

While certain embodiments of the invention have been illustrated and described, those skilled in the art with access to the present teachings will recognize that the invention is not limited to these embodiments only. Numerous modifications, changes, variations, substitutions, and equivalents will be apparent to those skilled in the art. Accordingly, it is to be understood that the invention is intended to cover all variations, modifications, and equivalents within the scope of the following claims.

What is claimed is:

1. A method for making a lighting apparatus, the method comprising:
    for an LED die of a plurality of LED dice configured to emit a first color, determining a target amount of a wavelength-shifting material capable of converting light of the first color to light of a second color, wherein the target amount is an amount that, when combined with light from the LED die, will result in light of a third color;
    disposing the plurality of LED dice on a substrate to form a lighting apparatus;
    depositing less than the target amount of the wavelength-shifting material over each of a first subset of the plurality of LED dice;
    depositing more than the target amount of the wavelength-shifting material over each of a second subset of the plurality of LED dice;
    coupling the first subset of the plurality of LED dice and the second subset of the plurality of LED dice to a power controller; and
    using the power controller to adjust relative brightness of the first subset and the second subset of the plurality of LED dice such that the lighting apparatus is configured to produce light of the third color.

2. The method of claim 1 wherein the wavelength-shifting material is mixed in a base material to form a light-conversion material, and wherein the amount of wavelength-shifting material deposited is controlled by controlling an amount of light-conversion material deposited.

3. The method of claim 1 wherein the wavelength-shifting material is mixed in a base material to form a light-conversion material, and wherein the amount of wavelength-shifting material deposited is controlled by controlling a ratio of the wavelength-shifting material to the base material in the light-conversion material.

4. The method of claim 1 wherein the first color is blue, the second color is yellow, and the third color is white.

5. The method of claim 4 wherein the wavelength-shifting material comprises yellow phosphor.

6. The method of claim 4 wherein the amount less than the target amount is selected such that the LED dice in the first subset is configured to provide cool white light in conjunction with the wavelength-shifting material, and the amount more than the target amount is selected such that the LED dice in the second subset is configured to provide warm white light in conjunction with the wavelength-shifting material.

7. The method of claim 1 wherein the wavelength-shifting material includes yellow and red phosphors.

8. The method of claim 7 wherein the wavelength-shifting material includes yellow and red phosphors at a weight ratio of about 4:1.

9. The method of claim 7 wherein the wavelength-shifting material includes yellow and red phosphors at a weight ratio of about 20:1.

10. The method of claim 1 wherein the first color is green, the second color is magenta, and the third color is white.

11. The method of claim 1 wherein the first color is red, the second color is cyan, and the third color is white.

12. The method of claim 1 wherein adjusting relative brightness of the first subset and the second subset of the plurality of LED dice comprises using one or more variable resistances to adjust currents in the first plurality and second plurality of LED dice.

13. A lighting apparatus, comprising:
    a first set of one or more light-emitting diode (LED) dice, each configured to emit light of a first color and having a first amount of a complementary wavelength-shifting material disposed thereover, the complementary wavelength-shifting material being configured to convert light of the first color to light of a second color, the first amount being less than an amount required to produce white light in conjunction with light of the first color;
    a second set of one or more LED dice, each configured to emit light of the first color and having a second amount of the complementary wavelength-shifting material disposed thereover, the second amount being more than the amount required to produce white light in conjunction with light of the first color; and
    a power control circuit coupled to the first set and the second set of LED dice, the power control circuit being configured to control the relative brightness of the first set and the second set of LED dice.

14. The apparatus of claim 13 wherein the wavelength-shifting material is mixed in a base material to form a light-conversion material, and wherein the first set of LED dice and the second set of LED dice have different amounts of the light-conversion material overlaid thereon.

15. The apparatus of claim 13 wherein the wavelength-shifting material is mixed in a base material to form a light-conversion material, and wherein the first set of LED dice and the second set of LED dice have different ratios of the wavelength-shifting material to the base material in the light-conversion material overlaid thereon.

16. The apparatus of claim 13 wherein the first amount of the wavelength-shifting material is an amount that, in conjunction with light from the first set of LED dice, will produce cool white light, and the second amount of the wavelength-shifting material is an amount that, in conjunction with light from the second set of LED dice, will produce warm white light.

17. The apparatus of claim 13 wherein the first color is blue, and the wavelength-shifting material comprises yellow phosphor.

18. The apparatus of claim 13 wherein the first color is green, and the second color is magenta.

19. The apparatus of claim 13 wherein the first color is red, and the second color is cyan.

20. The apparatus of claim 13 wherein the wavelength-shifting material includes yellow and red phosphors.

21. The apparatus of claim 20 wherein the wavelength-shifting material includes yellow and red phosphors at a weight ratio of about 4:1.

22. The apparatus of claim 20 wherein the wavelength-shifting material includes yellow and red phosphors at a weight ratio of about 20:1.

23. The apparatus of claim 13 wherein the power control circuit comprises one or more variable resistances for adjusting currents in the first and second sets of LED dice.

24. A lamp for providing white light, the lamp comprising:

a first set of one or more light-emitting diode (LED) dice, each of which is configured to emit light of a first color and has a first amount of a complementary wavelength-shifting material disposed thereover, the first amount being less than an amount required to produce white light in conjunction with light of the first color;

a second set of one or more LED dice, each of which is configured to emit light of the first color and has a second amount of the complementary wavelength-shifting material disposed thereover, the second amount being more than an amount required to produce white light in conjunction with light of the first color;

a primary lens overlying the first set and the second set of LED dice;

a secondary lens overlying the first set and the second set of LED dice and the primary lens, the secondary lens being configured to mix light from the first set and the second set of LED dice at least partially via total internal reflection; and a power control circuit coupled to the first set and the second set of LED dice, the power control circuit being configured to control the relative brightness of the first set and the second set of LED dice.

25. The apparatus of claim 24 wherein each of the first set of LED dice is configured to produce cool white light, and wherein each of the second set of LED dice is configured to produce warm white light.

26. The apparatus of claim 24 wherein the wavelength-shifting material is mixed in a base material to form a light-conversion material, and wherein the first set of LED dice and the second set of LED dice have different amounts of the light-conversion material overlaid thereon.

27. The apparatus of claim 24 wherein the wavelength-shifting material is mixed in a base material to form a light-conversion material, and wherein the first set of LED dice and the second set of LED dice have different ratios of the wavelength-shifting material to the base material in the light-conversion material overlaid thereon.

28. The apparatus of claim 24 wherein the first amount of the wavelength-shifting material is an amount that, in conjunction with light from the first set of LED dice, will produce cool white light, and the second amount of the wavelength-shifting material is an amount that, in conjunction with light from the second set of LED dice, will produce warm white light.

29. The apparatus of claim 24 wherein the first color is blue, and the wavelength-shifting material comprises yellow phosphor.

* * * * *